US008510498B2

(12) United States Patent
Takashima (10) Patent No.: US 8,510,498 B2
(45) Date of Patent: Aug. 13, 2013

(54) MEMORY SYSTEM

(75) Inventor: Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 428 days.

(21) Appl. No.: 12/526,346

(22) PCT Filed: Oct. 3, 2008

(86) PCT No.: PCT/JP2008/068405
§ 371 (c)(1), (2), (4) Date: Aug. 7, 2009

(87) PCT Pub. No.: WO2009/054272
PCT Pub. Date: Apr. 30, 2009

(65) Prior Publication Data
US 2010/0325343 A1    Dec. 23, 2010

(30) Foreign Application Priority Data
Oct. 26, 2007    (JP) .................................. 2007-278623

(51) Int. Cl.
*G06F 12/00*    (2006.01)

(52) U.S. Cl.
USPC .................................. 711/103; 711/E12.017

(58) Field of Classification Search
USPC ........................................................ 711/103
See application file for complete search history.

(56) References Cited

U.S. PATENT DOCUMENTS 5,883,842 A * 3/1999 Miyauchi ...................... 365/200
2004/0177216 A1* 9/2004 Asari et al. .................... 711/103

OTHER PUBLICATIONS

Park, C. et al., "A High Performance Controller for NAND Flash-based Solid State Disk (NSSD)", IEEE, pp. 17-20, (2006).
Combined Chinese Office Action and Seach Report issued Oct. 18, 2012, in Chinese Patent Application No. 200880006665.6 with English translation and English translation of category of cited documents.
Chinese Office Action issued on May 11, 2012, in Chinese Patent Application No. 200880006665.6 (with English Translation).

* cited by examiner

*Primary Examiner* — Reginald Bragdon
*Assistant Examiner* — Hamdy S Ahmed
(74) *Attorney, Agent, or Firm* — Oblon, Spivak, McClelland, Maier & Neustadt, L.L.P.

(57) ABSTRACT

This disclosure concerns a memory system including: chips (MC00-MC37) laid out with erasure blocks, the erasure blocks respectively being formed by laying out with pages and being an erasure unit, the pages respectively being formed by laying out with cells; IO line groups connected to the chips, wherein the chips connected to the same IO line group form a memory group (MG0-MG3), and the memory group is divided into first to n-th sub-memory groups (BB-SGA to BB-SGD), and number of bad blocks of the chip having a smallest number of bad blocks in a k-th sub-memory group in the memory groups is larger than number of bad blocks of the chip having a largest number of the bad blocks in a (k+1)-th sub-memory group in the memory groups, the bad blocks are the erasure blocks in which erasing, writing or reading of data cannot be performed correctly.

10 Claims, 10 Drawing Sheets

MEMORY SYSTEM

BACKGROUND OF THE INVENTION

1. Field of the Invention

The present invention relates to a memory system, and for example relates to a memory system using a NAND flash memory.

2. Related Art

Semiconductor memories are used in main memories of large computers, personal computers, home electric appliances, portable telephones or the like. Flash EEPROM non-volatile memories (hereinafter, "NAND flash memories") are applied to various memory mediums (SD cards, MMCs (Multi Media Cards), MS (Magnetic Stripe) cards, CFs (Compact Flash) cards, USB memories, SSDs (Solid-State-Disks) or the like. The NAND flash memories are used as information memory mediums of images, moving pictures, sound, games or the like, in digital cameras, digital video cameras, music devices of MP3's, mobile devices, digital televisions or the like. Further, the NAND flash memories are also used as memory mediums alternative to HDDs of personal computers.

The NAND flash memories perform data writing/reading operations in a page unit consisting of plural memory cells, and perform a data erasing operation in a block unit consisting of plural pages. In the verification of the data writing/reading operations, blocks determined as defective blocks are not accessed in the normal operation, by regarding these blocks as bad blocks. Bad blocks are permitted to a certain level in one memory chip. The permissible number of bad blocks can be optionally set.

In a NAND flash memory system including plural memory chips, the plural memory chips are operated in parallel, to achieve high-speed reading/high-speed writing of data. When plural memory chips are operated in parallel, blocks of which reading/writing are valid must be valid together in plural memory chips as well. Therefore, in the plural memory chips to be operated in parallel, the number of valid blocks, that is, a memory capacity, is limited by a memory chip having a largest number of bad blocks among the plural memory chips. If one chip has a large number of bad blocks in plural memory chips operated in parallel, a memory capacity is determined by this chip. For example, when the number of bad blocks in each of four chips operated in parallel is one, fifty, two, and three, respectively, the total number of valid blocks of the four chips operated in parallel is limited by the memory chip having the fifty bad blocks. In this case, unused valid blocks in other three chips become wasteful.

SUMMARY OF THE INVENTION

A memory system according to an embodiment of the present invention comprises:

a plurality of memory chips laid out with a plurality of erasure blocks, the erasure blocks respectively being formed by laying out with a plurality of pages and being an erasure unit, the pages respectively being formed by laying out with a plurality of memory cells and being a writing unit or a reading unit, the memory cells having floating gates in which data can be electrically erased, written and read;

a plurality of IO line groups connected to the plurality of memory chips, and transferring an address signal determining the erasure block, and transferring data to be written into the memory cells and data to be read from the memory cells; and a controller controlling the plurality of memory chips, wherein the memory chips, which are connected to the same IO line group out of the plurality of IO line groups, form a memory group, and the memory group in each of the plurality of IO line groups is divided into first to n-th (n is a natural number equal to or larger than two) sub-memory groups, and number of bad blocks of the memory chip having a smallest number of bad blocks in a k-th (k is a natural number from 1 to (n−1)) sub-memory group in the plurality of memory groups is larger than number of bad blocks of the memory chip having a largest number of the bad blocks in a (k+1)-th sub-memory group in the plurality of memory groups, the bad blocks being the erasure blocks in which erasing, writing or reading of data cannot be performed correctly.

A memory system according to an embodiment of the present invention comprises:

a plurality of memory chips laid out with a plurality of erasure blocks, the erasure blocks respectively being formed by laying out with a plurality of pages and being an erasure unit, the pages respectively being formed by laying out with a plurality of memory cells and being a writing unit or a reading unit, the memory cells having floating gates in which data can be electrically erased, written and read;

a plurality of IO line groups connected to the plurality of memory chips, and transferring an address signal determining the erasure block, and transferring data to be written into the memory cells and data to be read from the memory cells; and a controller controlling the plurality of memory chips, wherein the memory chips, which are connected to the same IO line group out of the plurality of IO line groups, form a memory group, and the memory group in each of the plurality of IO line groups is divided into first to n-th (n is a natural number equal to or larger than two) sub-memory groups, and a total number of bad blocks in a k-th (k is a natural number from 1 to (n−1)) sub-memory group in the plurality of memory groups is larger than a total number of bad blocks in a (k+1)-th sub-memory group in the plurality of memory groups, the bad blocks being the erasure blocks in which erasing, writing or reading of data cannot be performed correctly.

DETAILED DESCRIPTION OF THE INVENTION

Embodiments of the present invention will be explained below in detail with reference to the accompanying drawings. Note that the invention is not limited thereto.

A flash EEPROM nonvolatile memories are mainly allocated to an NOR type and a NAND type. A NOR flash memories can perform the read operation at a high speed, and has a large number of readable times of about $10^{13}$ times. Therefore, the NOR flash memories are used as memory devices of instruction codes of portable devices. However, the NOR flash memories have a small effective band width of writing, and are not suitable for recording files.

On the other hand, a NAND flash memories have a slow access time of about 50 μs. However, the NAND flash memories have a higher integration level than the NOR flash memories, and can perform a burst reading. The NAND flash memories have a data program (writing) time of 800 μs, and have a slow data erasing time of about 1 ms. However, the NAND flash memories can erase a large number of bits at one time, and can write data in the burst mode, thereby programming a large number of bits at one time. Therefore, the NAND flash memories are memories having a large effective band width. The NAND flash memories having a large effective band width like this are suitable for file memories of memory cards, USB memories, SSD or the like as described above.

The following embodiments explain a memory system using a NAND flash memory.

First Embodiment

Figure 1:
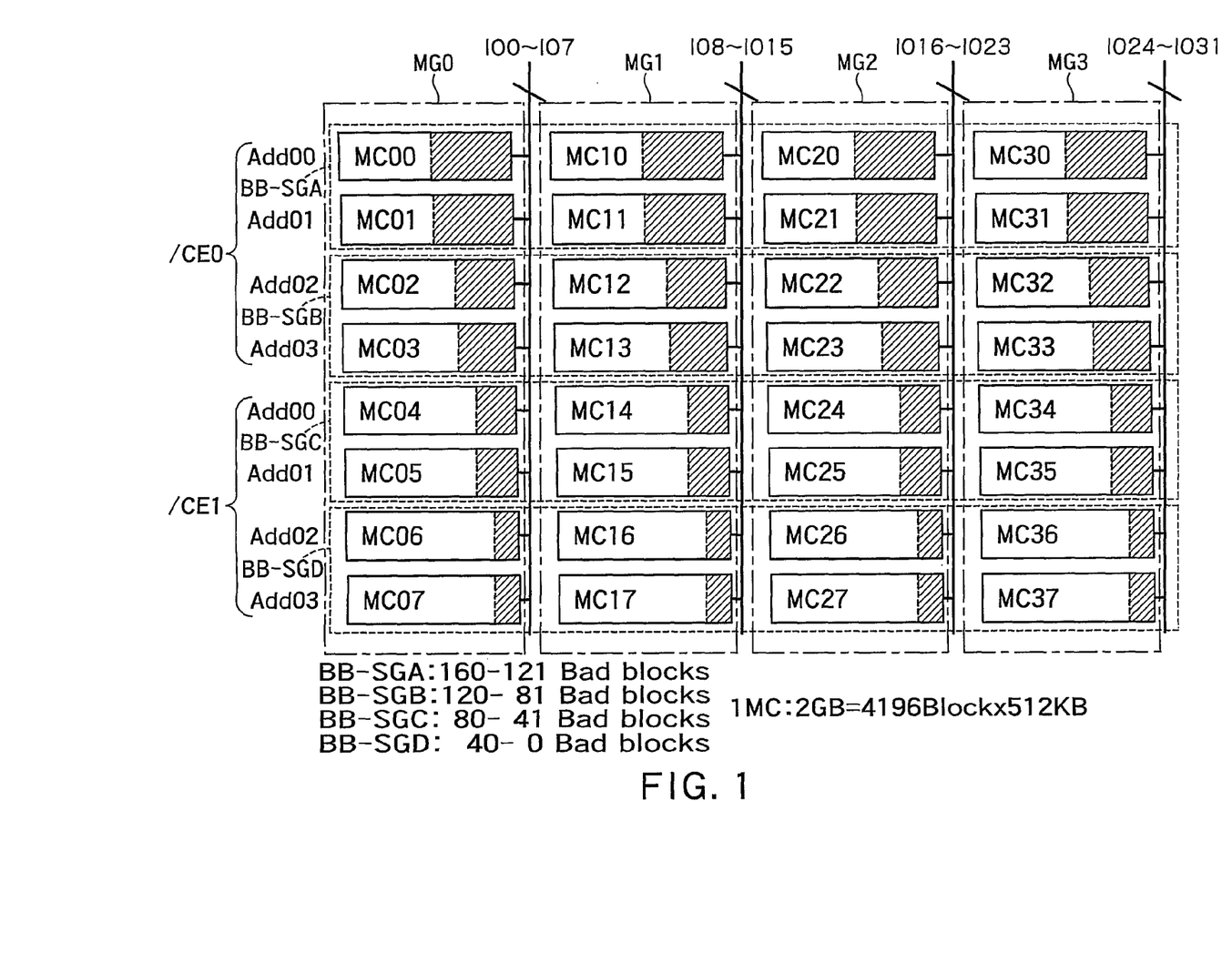
FIG. 1 is a configuration diagram showing one example of a memory system according to a first embodiment of the present invention.

FIG. 1 is a configuration diagram showing one example of a memory system according to a first embodiment of the present invention. The memory system according to the first embodiment includes memory chips MC00 to MC07, MC10 to MC17, MC20 to MC27, MC30 to MC37, plural IO (Input/Output) lines IO0 to IO7, IO8 to IO15, IO16 to IO23, and IO24 to IO31. Memory chips MCij (i=0 to 3, j=0 to 7) are memory chips of a NAND flash EEPROM. Each memory chip MCij has 4,196 erasure unit blocks in 512 KB size. That is, each memory chip MCij has equal memory capacity, and has a memory space of 2 GB.

Figure 6:
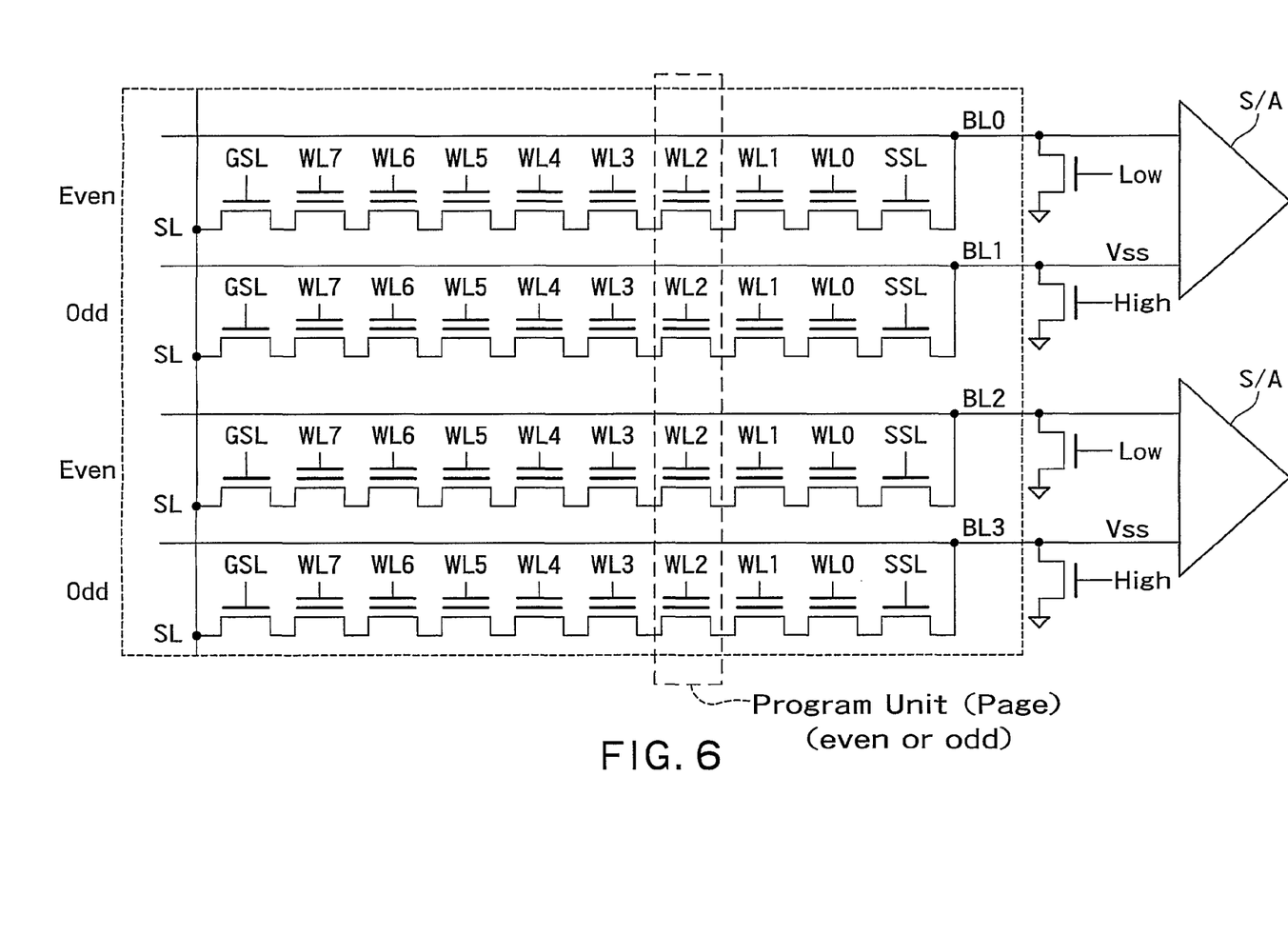
FIG. 6 is a circuit diagram showing memory blocks.

Each memory chip MCij includes plural memory cells. Each memory cell has a floating gate, and can electrically erase, write, and read data. Plural memory cells form a page becoming a writing unit and a reading unit. Further, plural pages form an erasure block becoming an erasure unit (FIG. 6). Each memory chip MCij is formed by including plural blocks.

The IO line group IO0 to IO7 is connected in common to the memory chips MC00 to MC07. The IO line group IO8 to IO15 is connected in common to the memory chips MC10 to MC17. The IO line group IO16 to IO23 is connected in common to the memory chips MC20 to MC27. The IO line group IO24 to 1O31 is connected in common to the memory chips MC30 to MC37. Each group of the plural IO lines IO0 to IO7, IO8 to IO15, IO16 to IO23, and IO24 to IO31 transfers an address signal determining an erasure block, data written into memory cells, and data read from the memory cells, between the memory chip MCij and the outside of the memory system.

The plural memory chips MC00 to MC07 connected to the IO line group IO0 to IO7 form a memory group MG0. The plural memory chips MC10 to MC17 connected to the IO line group IO8 to IO15 form a memory group MG1. The plural memory chips MC20 to MC27 connected to the IO line group IO16 to IO23 form a memory group MG2. The plural memory chips MC30 to MC37 connected to the IO line group IO24 to IO31 form a memory group MG3. That is, plural memory chips connected to the same IO line group form one memory group.

Further, the memory groups MG0 to MG3 are divided into first to fourth sub-memory groups BB-SGA to BB-SGD corresponding to the number of bad blocks in which data cannot be correctly erased, written, or read. The first sub-memory group BB-SGA is a sub-memory group consisting of memory chips including 121 to 150 bad blocks. The second sub-memory group BB-SGB is a sub-memory group consisting of memory chips including 81 to 121 bad blocks. The third sub-memory group BB-SGC is a sub-memory group consisting of memory chips including 41 to 80 bad blocks. The fourth sub-memory group BB-SGD is a sub-memory group consisting of memory chips including 0 to 41 bad blocks.

In the first embodiment, the permissible number of bad blocks is set to 160 per one chip. Normally, while bad blocks are already present at the beginning of shipment, more bad blocks are generated during the use of memories due to degradation of reliability. Therefore, when the maximum number of bad blocks generated during the use of the memories is 10 at maximum, the permissible number of bad blocks at the beginning of the shipment becomes 150. In the first embodiment, the number of bad blocks is a sum of the number of bad blocks at the beginning of the shipment and the number of bad blocks generated after using the memories.

In the first embodiment, the sub-memory groups BB-SGA to BB-SGD are configured to include each two memory chips corresponding to the plural IO line groups IO0 to IO7, IO8 to IO15, IO16 to IO23, and IO24 to IO31, respectively. For example, the first sub-memory group BB-SGA includes two memory chips MC00 and MC01, two memory chips MC10 and MC11, two memory chips MC20 and MC21, and two memory chips MC30 and MC31, included in the plural IO line groups IO0 to IO7, IO8 to IO15, IO16 to IO23, and IO24 to IO31, respectively. Similarly, the second sub-memory group BB-SGB includes two memory chips MC02 and MC03, two memory chips MC12 and MC13, two memory chips MC22 and MC23, and two memory chips MC32 and MC33, included in the respective IO line groups. The third sub-memory group BB-SGC includes two memory chips MC04 and MC05, two memory chips MC14 and MC15, two memory chips MC24 and MC25, and two memory chips MC34 and MC35, included in the respective IO line groups. The fourth sub-memory group BB-SGD includes two memory chips MC06 and MC07, two memory chips MC16 and MC17, two memory chips MC26 and MC27, and two memory chips MC36 and MC37, included in the respective IO line groups. A hatching in each memory chip MCij shown in FIG. 1 conceptually shows the number of bad blocks.

The number of bad blocks in a memory chip having a smallest number of bad blocks in the first sub-memory group BB-SGA is larger than the number of bad blocks in a memory chip having a smallest number of bad blocks in the second sub-memory group BB-SGB. That is, the memory chips MC00, MC01, MC10, MC11, MC20, MC21, MC30, and MC31 in the first sub-memory group BB-SGA have a larger number of bad blocks than that in the memory chips MC02, MC03, MC12, MC13, MC22, MC23, MC32, and MC33 in the second sub-memory group BB-SGB, respectively. Similarly, the number of bad blocks in the memory chip having the smallest number of bad blocks in the second sub-memory group BB-SGB is larger than a number of bad blocks in a memory chip having a smallest number of bad blocks in the third sub-memory group BB-SGC. The number of bad blocks in the memory chip having the smallest number of bad blocks in the third sub-memory group BB-SGC is larger than a number of bad blocks in a memory chip having a smallest number of bad blocks in the fourth sub-memory group BB-SGD. This is generalized as follows. A number of bad blocks of a memory chip having a smallest number of bad blocks In a k-th (k is a natural number from 1 to (n−1)) sub-memory group is larger than a number of bad blocks of a memory chip having a largest number of bad blocks in a (k+1)-th sub-memory group. Further, this can be expressed as follows. The total number of bad blocks in the k-th sub-memory group is larger than the total number of bad blocks in the (k+1)-th sub-memory group.

As explained above, in the first embodiment, memory chips are classified in advance into sub-memory groups based on the number of bad blocks. Memory chips in the same sub-memory group are laid out in parallel so as to be adjacent to each IO line group. Conversely, memory chips can be classified in advance into sub-memory groups based on the number of valid blocks (number of good blocks). This is because each memory chip has a predetermined number of blocks, and because the number of valid blocks in each memory chip becomes a compliment of the number of bad blocks.

Plural memory chips included in each IO line group and laid out in parallel are selected by chip enable signals/CE0, /CE1, and address signals Add00 to Add03. For example, a memory chip MCi0 is selected by the chip enable signal/CE0 and the address signal Add00. Similarly, memory chips MCi1 to MCi3 are selected by the chip enable signal/CE0 and address signals Add01 to Add03, respectively. Memory chips MCi4 to MCi7 are selected by the chip enable signal/CE1 and the address signals Add00 to Add03, respectively.

In the first embodiment, memory chips are classified in advance into sub-memory groups based on the number of bad blocks, and memory chips in the same sub-memory group are laid out in parallel so as to be adjacent to each IO line group. Memory chips in the same sub-memory group are closer to each other than to memory chips in other sub-memory groups regarding the number of bad blocks. In this way, memory chips having mutually close numbers of bad blocks are laid out in parallel so as to be adjacent to each IO line group. Therefore, in the operations of programming (writing), reading, erasing, and writing verification, when plural memory chips selected by a certain chip-enable signal and a certain address signal are operated in parallel, numbers of bad blocks in plural memory chips operated in parallel are relatively uniform. For example, the memory chip MOO selected by the chip enable signal /CE0 and the address signal Add00 has a relatively uniform number of bad blocks within a range of 160 to 121. The parallel operation means a selection of plural memory chips connected to plural IO line groups and a simultaneous operation of the selected plural memory chips.

Because memory capacities of respective memory chips are equal, that the numbers of bad blocks of plural memory chips operated in parallel are relatively uniform means that the numbers of valid blocks (good blocks) of plural memory chips operated in parallel are relatively uniform. Therefore, in the first embodiment, a number of valid blocks becoming wasteful is smaller than a number in a conventional technique. Because the number of valid blocks becoming wasteful is small, in the memory system according to the first embodiment, it is possible to avoid a case that the total number of valid blocks in the entire system is small even when the total number of bad blocks in the entire system is small.

The total number of valid blocks of memory chips selected by the chip enable signal and the address signal and operated in parallel is determined by a memory chip having a largest number of bad blocks. However, because the sub-memory groups BB-SGA to BB-SGD are grouped based on a number of bad blocks, when the number of valid blocks in the sub-memory group BB-SGA is small, many valid blocks are present in the sub-memory groups BB-SGB to BB-SGD. A number of bad blocks of memory chips operated in parallel becomes equal to or smaller than 160, equal to or smaller than 120, equal to or smaller than 80, and equal to or smaller than 40, in each of the sub-memory groups BB-SGA to BB-SGD, respectively. By grouping the memory groups into the sub-memory groups BB-SGA to BB-SGD based on the number of bad blocks of each memory chip in this way, the entire capacity of the total memory system becomes larger than the conventional capacity.

That is, in the first embodiment, because the memory chips having substantially uniform numbers of bad blocks are operated in parallel, memory chips having small numbers of bad blocks can be operated simultaneously. This leads to increase in the valid memory capacity of the memory system.

Conversely, when the memory capacity of the memory system is set constant, the increased memory space can be used as a cache region in the memory system. Alternatively, the increased memory space can be used as a spare capacity to arrange data written in a page unit into an erasure block unit. Even when one erasure block contains many pages of false (duty) data, the increased memory space does not generate a shortage of a remaining capacity, and does not require any arrangement. As a result, writing performance of the entire system is improved. In this way, the effect of the increase in the valid memory capacity of the memory system has many advantages when the memory capacity of the memory system is set constant.

In the first embodiment, when an address is assigned to a bad block in a certain memory chip among plural memory chips operated in parallel, another valid block in this memory chip is selected.

The memory system according to the first embodiment selects one memory chip from each of the plural IO line groups IO0 to IO7, IO8 to IO15, IO16 to IO23, and IO24 to IO31, respectively, and operates these memory chips in parallel. Alternatively, the memory system can also select two or three memory chips connected to any one of the IO line groups IO0 to IO7, IO8 to IO15, IO16 to IO23, and IO24 to IO31, respectively, and operate these memory chips in parallel.

Figure 2:
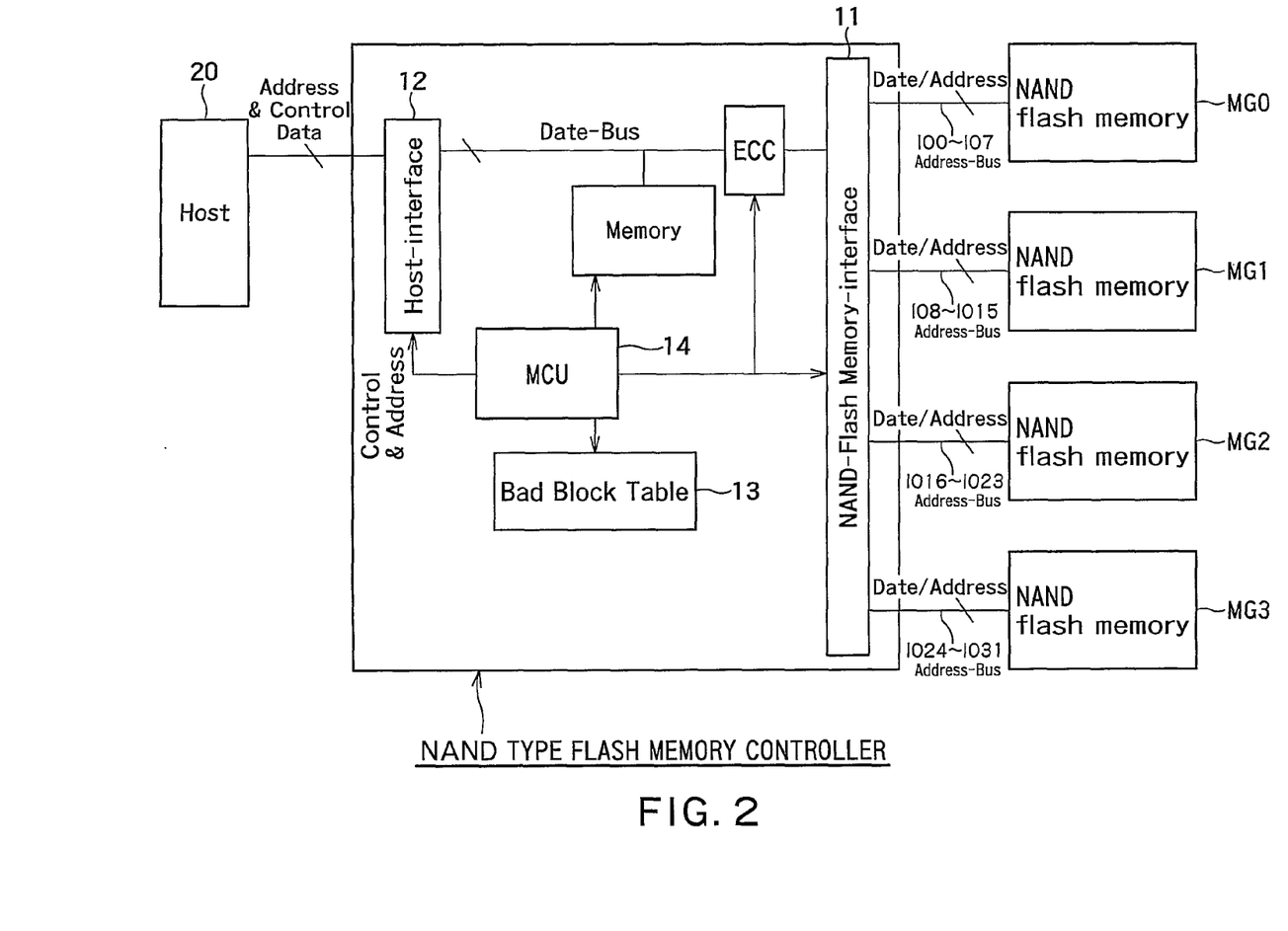
FIG. 2 is a block diagram showing a NAND flash memory controller (hereinafter, simply "controller") according to the first embodiment.

FIG. 2 is a block diagram showing a NAND flash memory controller (hereinafter, simply "controller") according to the first embodiment. The controller exchanges data with the memory groups MG0 to MG3 via the IO line groups IO0 to IO7, IO8 to IO15, IO16 to IO23, and IO24 to IO31, respectively. The controller also transmits the chip enable signals/ CE0, /CE1 and the address signals Add00 to Add03 to the memory groups MG0 to MG3 via address buses. The controller has a memory interface 11, and exchanges data with each memory group or transmits an address signal to each memory group via the interface 11. The controller has a host interface 12, and exchanges data with a host computer 20 or receives an address signal and the like from the host computer via the interface 12.

The controller has a bad block table 13. The bad block table 13 manages addresses of bad blocks in the memory chips MCij. With this arrangement, when an address from the host computer 20 assigns a bad block in a certain memory chip among plural memory chips operated in parallel, a CPU 14 can select an address of other valid block in the memory chip.

Figure 3:
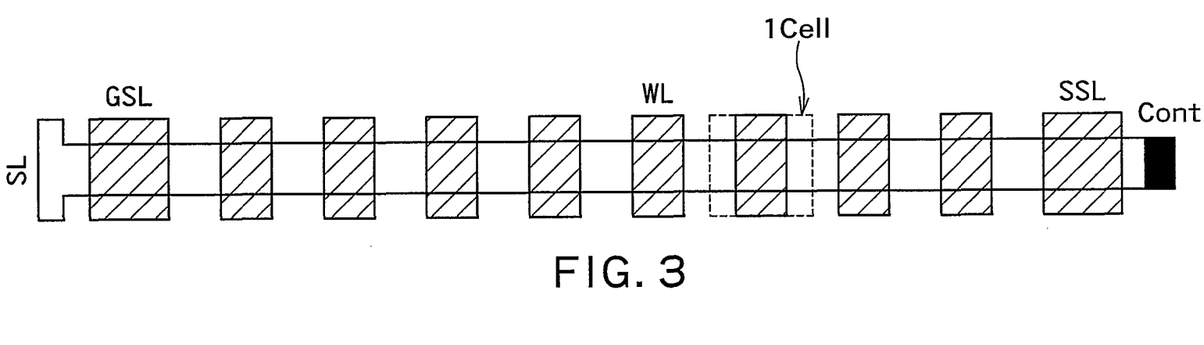
FIG. 3 is a plan view of a cell string of a NAND EEPROM.
Figure 4:
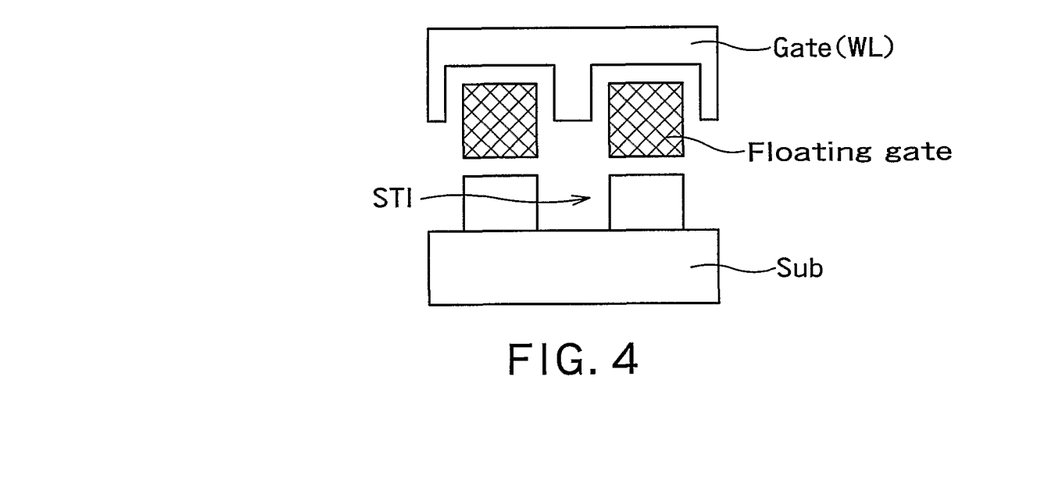
FIG. 4 is a cross-sectional view of two memory cells of the NAND EEPROM.
Figure 5:
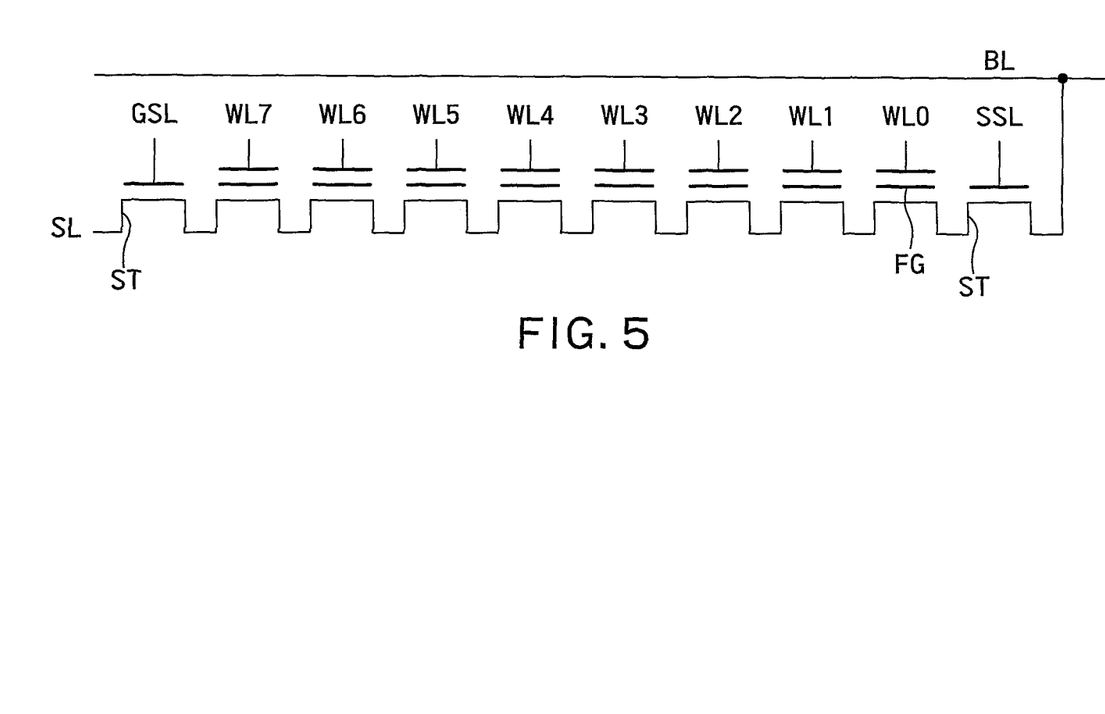
FIG. 5 is an equivalent circuit diagram of the cell string shown in FIG. 3.

FIG. 3 is a plan view of a cell string of a NAND EEPROM. FIG. 4 is a cross-sectional view of two memory cells of the NAND EEPROM. FIG. 5 is an equivalent circuit diagram of the cell string shown in FIG. 3. The cell string is formed by having plural memory cells connected in series, and is connected to the source line SL or the bit line BL via selection transistors STs provided at both ends of the series-connected memory cells. Only one bit-line contact and only one source-line contact are provided in the cell string. One memory cell is laid out at each intersection of the word line and the bit line. Therefore, the NAND EEPROM is suitable for high integration as compared with the NOR EEPROM. As shown in FIG. 4, each memory cell has a floating gate FG in an electrically floating state via a gate dielectric film on a substrate. A control gate (word line WL) is provided on the floating gate FG via the gate dielectric film. By controlling the control gate, electric charge is accumulated in the floating gate or electric charge is discharged from the floating gate. As a result, the memory cells can store data.

FIG. 6 is a circuit diagram showing memory blocks. A memory unit that performs erasure at one time is a memory cell block unit when observed from a bit line BL direction, and is a total (WL0 to WL7) of one Mat when observed in a word line WL direction. Therefore, in the first embodiment, a memory capacity in the erasure block unit becomes about 512 KB. This erasure unit is called a block. A writing unit/reading unit (page) is a memory cell connected to every other bit line (an even bit line or an odd bit line) out of memory cells connected to one word line WL in the block. Therefore, a memory cell connected to one word line WL includes two pages.

Figure 7:
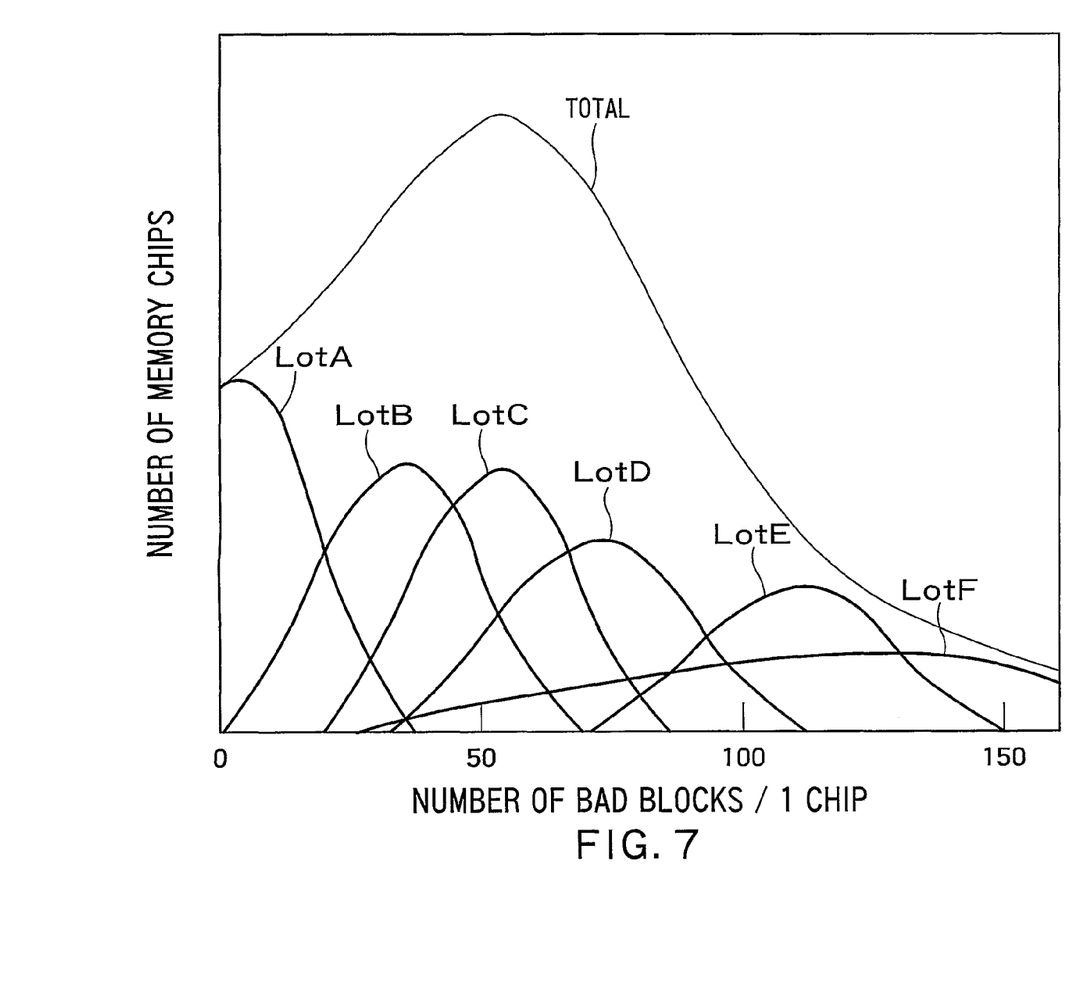
FIG. 7 is a distribution diagram of a number of bad blocks of memory chips.

FIG. 7 is a distribution diagram of a number of bad blocks of memory chips. The number of bad blocks for each memory chip is different for each lot in a wafer manufacturing process or for each wafer. For example, as shown in FIG. 7, in lots A to F, the number of bad blocks per memory chip is different for each lot. Therefore, in grouping the memory chips into the sub-memory groups BB-SGA to BB-SGD, it is preferable to select a memory chip from among plural lots. Even when the number of bad blocks per memory chip has a large variation in only the lot F due to an accident in the manufacturing process, a variation of the number of bad blocks in each sub-memory group can be decreased, by grouping the memory chips based on the total memory chips of the lots A to F. When a manufacturing process is stable, memory chips can be grouped into sub-memory groups in the same lot or in the same wafer.

Second Embodiment

Figure 8:
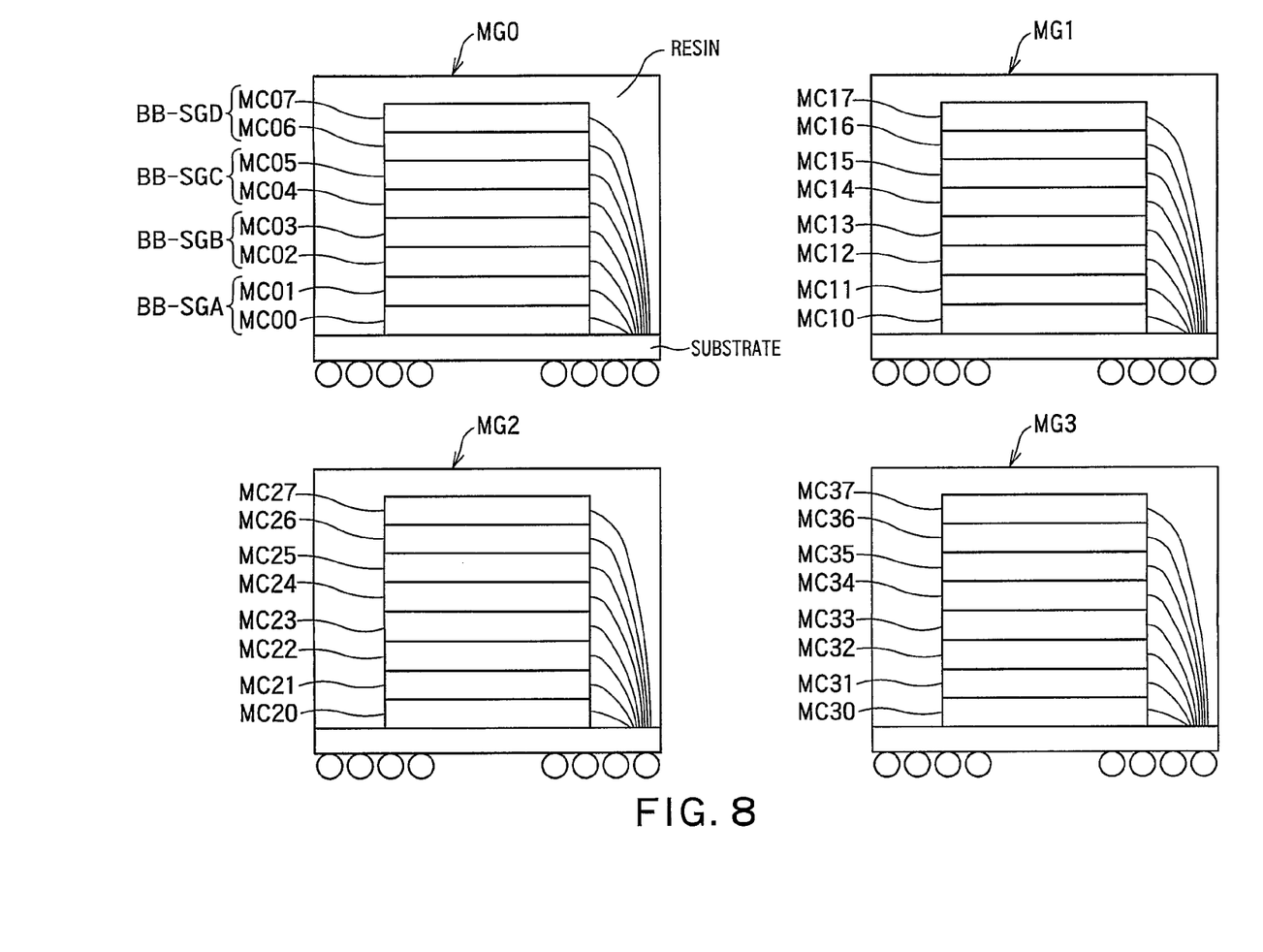
FIG. 8 shows one example of a method of packaging a memory system according to a second embodiment of the present invention.

FIG. 8 shows one example of a method of packaging a memory system according to a second embodiment of the present invention. In the second embodiment, the memory system shown in FIG. 1 is packaged for each of the memory groups MG0 to MG3. That is, plural memory chips included in each of the memory groups MG0 to MG3 are formed as one package after being sealed by a resin in a state of being stacked on a substrate. For example, the memory chips MC00 to MC07 included in the memory group MG00 are stacked on a substrate by each two chips in the order of the sub-memory groups BB-SGA to BB-SGD. Similarly, the other memory groups MG01 to MG03 are also stacked on the substrate by each two chips in the order of the sub-memory groups BB-SGA to BB-SGD. As explained above, in the second embodiment, a package is formed for each memory group, and the memory groups are stacked for each sub-group in one package. As a result, the memory system shown in FIG. 1 can be easily established. Each package (each memory group) is sufficiently established as far as the order of stacking is standardized. Therefore, the memory chips can be also stacked on the substrate in the order of the sub-memory groups BB-SGD, BB-SGC, BB-SGB, BB-SGA starting from the bottom.

Third Embodiment

Figure 9:
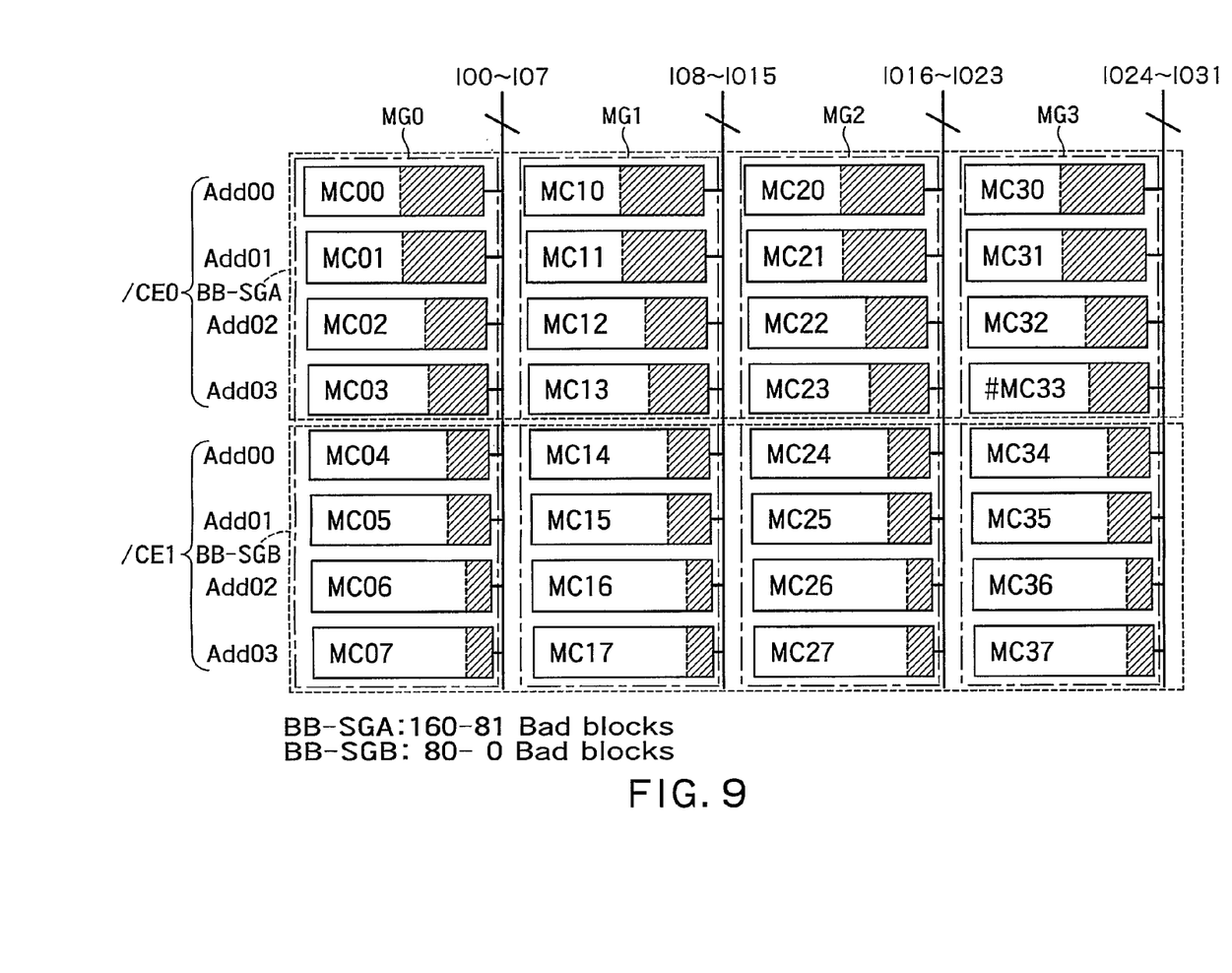
FIG. 9 is a configuration diagram showing one example of a memory system according to a third embodiment of the present invention.

FIG. 9 is a configuration diagram showing one example of a memory system according to a third embodiment of the present invention. In the first embodiment, sub-memory groups are divided into four. However, in the third embodiment, sub-memory groups are divided into two (BB-SGA and BB-SGB). Other configurations of the third embodiment can be the same as those of the first embodiment.

A first sub-memory group BB-SGA is a sub-memory group including memory chips containing 81 to 160 bad blocks. A second sub-memory group BB-SGB is a sub-memory group including memory chips containing 0 to 80 bad blocks. The number of bad blocks of a memory chip having a smallest number of bad blocks in the first bus-memory group BB-SGA is larger than the number of bad blocks of a memory chip having a smallest number of bad blocks in the second sub-memory group BB-SGB. In other words, the total number of bad blocks in the first sub-memory group is larger than the total number of bad blocks in the second sub-memory group. In this way, the effects of the present invention are not lost when the number of sub-memory groups is two.

The number of sub-memory groups can be three or five or more. That is, the memory chips can be classified into three or five or more sub-memory groups based on the number of bad blocks.

Fourth Embodiment

Figure 10:
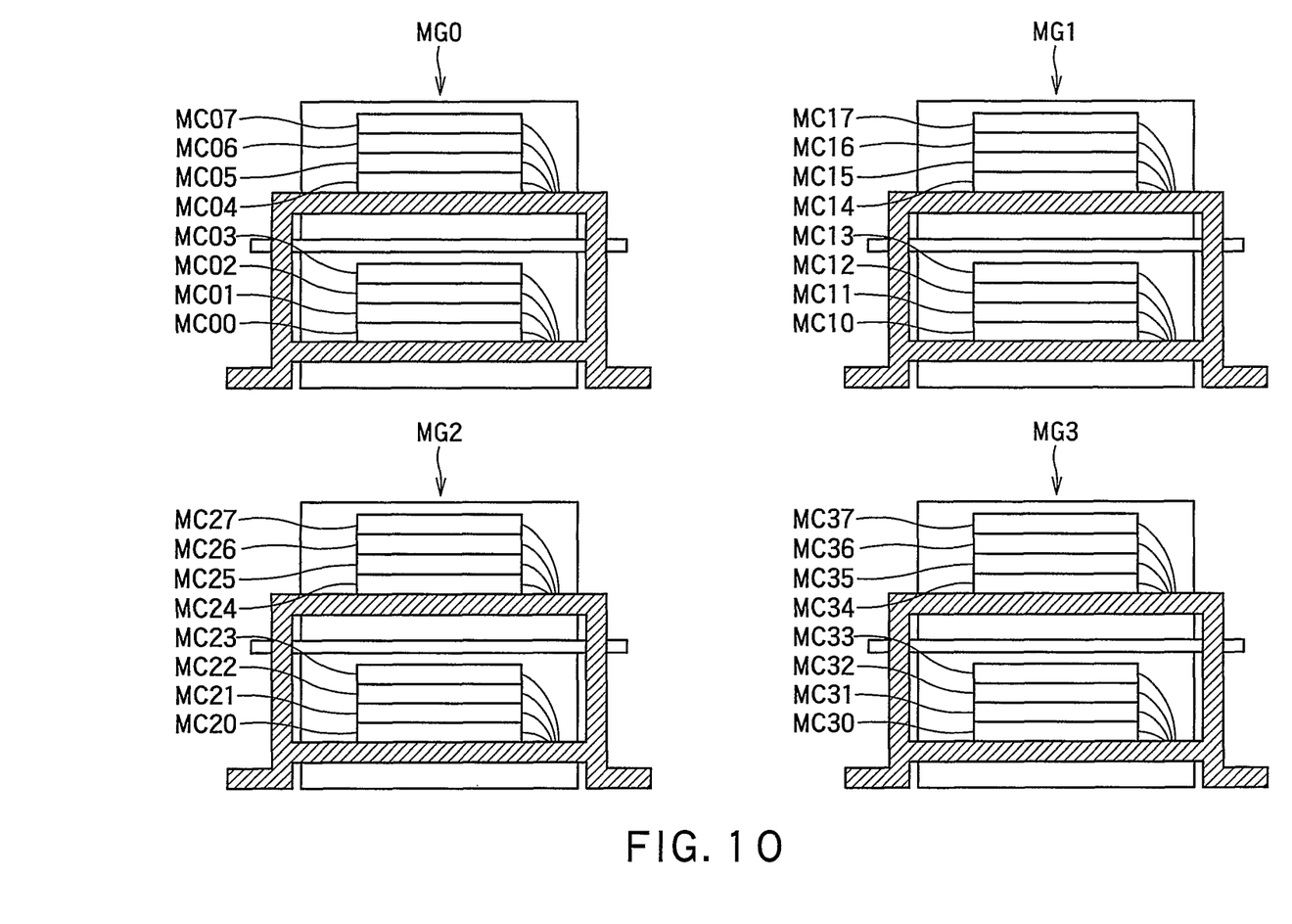
FIG. 10 shows one example of a method of packaging a memory system according to a fourth embodiment of the present invention.

FIG. 10 shows one example of a method of packaging a memory system according to a fourth embodiment of the present invention. In the fourth embodiment, each of the memory groups MG0 to MG3 is configured by two four-chip stacked packages (sub-packages). In each memory group, two four-chip stacked packages are further stacked, thereby configuring a main package. It can be said that the two four-chip stacked packages configure a package-on-package (POP).

While the packaging method according to the fourth embodiment can be also applied to the first embodiment, the packaging method according to the fourth embodiment is more preferably applied to a mode of two sub-memory groups like in the third embodiment. When the two sub-memory groups are used, a four-chip stacked package can be formed for each sub-memory group. Therefore, manufacturing of the memory system becomes easy because it is clear that the memory chips in the four-chip stacked package belong to the same sub-memory group. When one package is formed for each sub-memory group, the number of bad blocks can be counted for each package, and the memory system can be easily established based on a result of the counting.

Fifth Embodiment

Figure 11:
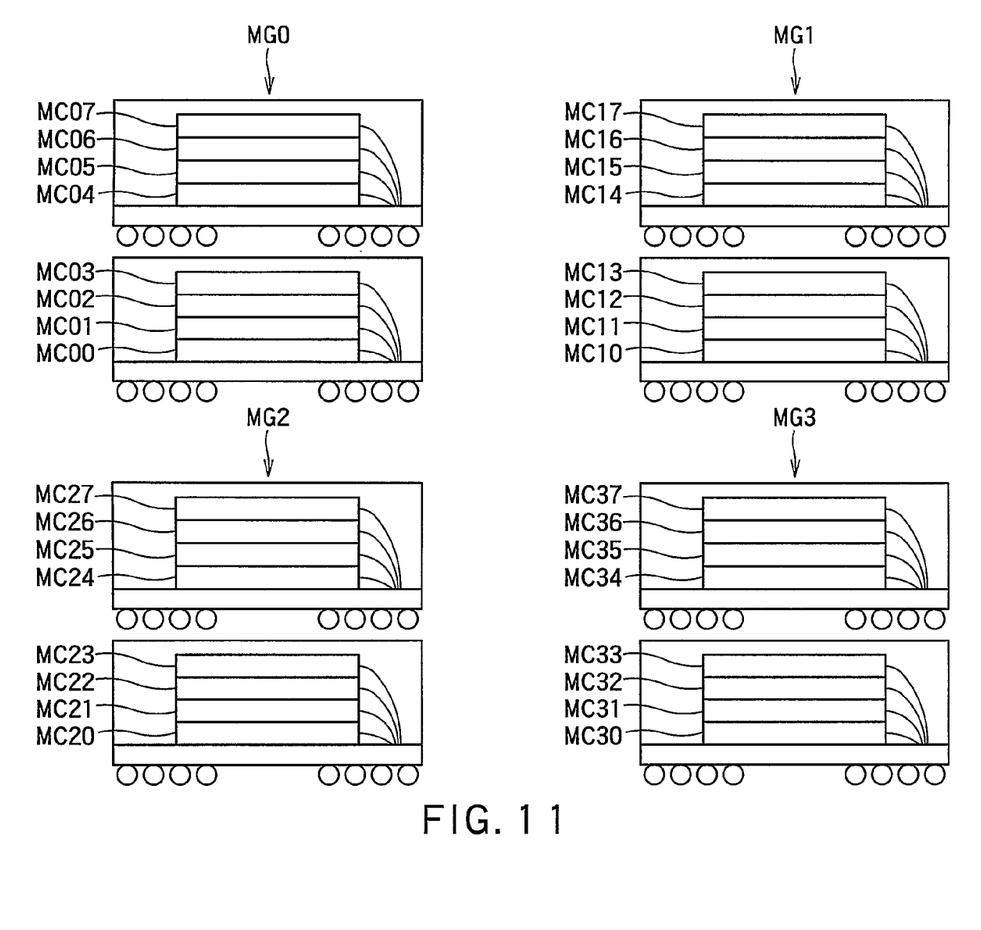
FIG. 11 shows one example of a method of packaging a memory system according to a fifth embodiment of the present invention.

FIG. 11 shows one example of a method of packaging a memory system according to a fifth embodiment of the present invention. The fifth embodiment is similar to the fourth embodiment in that a four-chip stacked package is formed for each sub-memory group. However, in the fifth embodiment, each four-chip stacked package is formed as an independent package, without further stacking a four-chip stacked package for each sub-memory group.

While the packaging method according to the fifth embodiment can be also applied to the first embodiment like the fourth embodiment, the packaging method according to the fifth embodiment is more preferably applied to a mode of two sub-memory groups like in the third embodiment. According to the fifth embodiment, because one package is formed for each sub-memory group, the package can be mounted for each sub-memory group.

The above embodiments can be applied to binary memory cells and multi-value memory cells. For example, in the case of a four-value memory cell that stores 2-bit information into one memory cell, an upper bit and a lower bit are stored into one word line. When a series number of four-value memory cells in a cell string is 32 cells, for example, a writing (program) unit is 4K bits. In the reading, either even-address bit lines or odd-address bit lines are read out simultaneously. At the time of reading even-address bit lines, for example, odd-address bit lines are set to a source potential Vss to decrease interference noise between adjacent even-address bit lines. This four-value system is suitable for high density.

While the memory systems in the above embodiments include 38 memory chips, the number of memory chips can be equal to or smaller than 37 or equal to or larger than 39. The number of memory groups and the number of sub-memory groups can be optionally changed. Therefore, the number of memory chips operated in parallel can be smaller than three or larger than five. Further, the memory capacity of one memory chip is not limited to 2 G bits.

The invention claimed is:

1. A memory system comprising:
a plurality of memory chips laid out with a plurality of erasure blocks, the erasure blocks respectively being formed by laying out with a plurality of pages and being an erasure unit, the pages respectively being formed by laying out with a plurality of memory cells and being a writing unit or a reading unit to be written and read; and
a plurality of IO line groups connected to the plurality of memory chips, and transferring an address signal determining the erasure block, and transferring data to be written into the memory cells and data to be read from the memory cells;
wherein
the memory chips, which are connected to the same IO line group out of the plurality of IO line groups, form a memory group, and the memory group in each of the plurality of IO line groups is divided into a plurality of sub-memory groups,
number of bad blocks of the memory chip having a smallest number of bad blocks in a first sub-memory group in the plurality of memory groups is larger than number of bad blocks of the memory chip having a largest number of the bad blocks in a second sub-memory group adjacent to the first sub-memory group in the plurality of memory groups, the bad blocks being the erasure blocks in which erasing, writing or reading of data cannot be performed correctly.

2. The memory system according to claim 1, wherein the memory system selects the memory chips belonging to the first sub-memory group and also belonging to each of the plurality of memory groups, and simultaneously operates the selected memory chips.

3. The memory system according to claim 1, wherein the memory chips included in each of the plurality of sub-memory groups of each of the plurality of memory groups are formed in one sub-package in a stacked state, and
the sub-package formed for each of the sub-memory groups is stacked by a plurality of numbers to form one main package.

4. The memory system according to claim 1, wherein the memory chips included in each of the plurality of sub-memory groups of each of the plurality of memory groups are formed in one sub-package in a stacked state, and
the sub-package for each of the sub-memory groups is formed as an independent package.

5. A memory system comprising:
a plurality of memory chips laid out with a plurality of erasure blocks, the erasure blocks respectively being formed by laying out with a plurality of pages and being an erasure unit, the pages respectively being formed by laying out with a plurality of memory cells and being a writing unit or a reading unit to be written and read; and
a plurality of IO line groups connected to the plurality of memory chips, and transferring an address signal determining the erasure block, and transferring data to be written into the memory cells and data to be read from the memory cells;
wherein
the memory chips, which are connected to the same IO line group out of the plurality of IO line groups, form a memory group, and the memory group in each of the plurality of IO line groups is divided into first to a plurality of sub-memory groups, and
a total number of bad blocks in a first sub-memory group in the plurality of memory groups is larger than a total number of bad blocks in a second sub-memory group adjacent to the first sub-memory group in the plurality of memory groups, the bad blocks being the erasure blocks in which erasing, writing or reading of data cannot be performed correctly.

6. The memory system according to claim 5, wherein the memory system selects the memory chips belonging to the first sub-memory group and also belonging to each of the plurality of memory groups, and simultaneously operates the selected memory chips.

7. The memory system according to claim 5, wherein the memory chips included in each of the plurality of sub-memory groups of each of the plurality of memory groups are formed in one sub-package in a stacked state, and
the sub-package formed for each of the sub-memory groups is stacked by a plurality of numbers to form one main package.

8. The memory system according to claim 5, wherein the memory chips included in each of the plurality of sub-memory groups of each of the plurality of memory groups are formed in one sub-package in a stacked state, and
the sub-package for each of the sub-memory groups is formed as an independent package.

9. The memory system according to claim 1, wherein the memory chips included in each of the plurality of memory groups are formed in one package in a stacked state.

10. The memory system according to claim 5, wherein the memory chips included in each of the plurality of memory groups are formed in one package in a stacked state.

\* \* \* \* \*